United States Patent [19]
Lee et al.

[11] Patent Number: 6,101,027
[45] Date of Patent: Aug. 8, 2000

[54] ALL-OPTICAL WAVELENGTH CONVERTER USING A SEMICONDUCTOR OPTICAL AMPLIFIER AND A POLARIZATION INTERFEROMETER

[75] Inventors: Hak Kyu Lee; Kyong Hon Kim; Joon Tae Ahn; Min Yong Jeon; Dong Sung Lim; Ho Young Kim, all of Daejon-Shi, Rep. of Korea

[73] Assignee: Electronics and Telecommunications Research Institute, Daejon-shi, Rep. of Korea

[21] Appl. No.: 09/145,545

[22] Filed: Sep. 2, 1998

[30] Foreign Application Priority Data

Dec. 27, 1997 [KR] Rep. of Korea .................... 97-75364

[51] Int. Cl.[7] .................................................. H01S 3/00
[52] U.S. Cl. ........................................ 359/344; 359/332
[58] Field of Search .................................. 354/332, 326, 354/344

[56] References Cited

U.S. PATENT DOCUMENTS

| | | | |
|---|---|---|---|
| 5,434,700 | 7/1995 | Yoo . | |
| 5,555,121 | 9/1996 | Dupont et al. . | |
| 5,754,334 | 5/1998 | Artiglia et al. | 359/332 |
| 5,903,384 | 5/1999 | Bülow | 359/332 |
| 5,940,207 | 8/1999 | Weich et al. | 359/333 |
| 5,978,129 | 11/1999 | Jourdan et al. | 359/326 |

FOREIGN PATENT DOCUMENTS 10-224403 of 1998 Japan .

OTHER PUBLICATIONS

C. Joergensen et al., "40 Gbit/s all–optical wavelength conversion by semiconductor optical amplifiers", Electronics Letters, 15th Feb. 1996, vol. 32, No. 4, pp. 367–368.

*Primary Examiner*—Mark Hellner
*Attorney, Agent, or Firm*—Jacobson, Price, Holman & Stern, PLLC

[57] ABSTRACT

The present invention discloses an all-optical wavelength converter using a semiconductor optical amplifier and a polarization interferometer. The all-optical wavelength converter using a semiconductor optical amplifier and a polarization interferometer including a wavelength converter which modulates a probe light into a inverting waveform to a signal light and outputs the modulated light by using cross gain modulation, a phenomenon that occurs while the signal light and the probe light pass together through an optical splitter/combiner, a semiconductor optical amplifier and a filter at the same time, a polarization interferometer which makes the probe light outputted from the wavelength converter and having the inverting waveform to the signal light undergo a double-refraction so that a predetermined time split occurs on it and provides a non-inverting wavelength conversion and suppresses the slow XGM components in the converted outputs due to the slow carrier recombination time.

2 Claims, 1 Drawing Sheet

Input ($\lambda_s$)

Slow Axis ($\lambda_p$)

Fast Axis ($\lambda_p$)

Output ($\lambda_p$)

ALL-OPTICAL WAVELENGTH CONVERTER USING A SEMICONDUCTOR OPTICAL AMPLIFIER AND A POLARIZATION INTERFEROMETER

BACKGROUND OF THE INVENTION

The present invention relates to an all-optical wavelength converter used in an ultrahigh-speed wavelength division multiplexing optical communication system network and, more particularly, to an all-optical wavelength converter using a semiconductor optical amplifier and a polarization interferometer which are going to be used as crucial devices in an ultrahigh-speed wavelength division multiplexing optical communication system network.

A wavelength converter for converting a wavelength of transmitted signals to a wanted wavelength is used in the case of matching a wavelength of a transmission system to that of respective sub-net or node and is also used in the case of wavelength reuse.

A conventional wavelength converter using cross gain modulation (hereafter, referred as XGM) of a semiconductor amplifier is shown in FIG. 1.

In order to use XGM of a semiconductor amplifier, a signal light of wavelength $\lambda 1$ and a continuous wave laser of wavelength $\lambda 2$ should be inputted into the semiconductor amplifier at the same time, then the light of wavelength $\lambda 2$ undergoes a change by gain competition between two wavelengths and becomes a complementary signal that is fully inverted compared to the signal light.

The method mentioned above has an advantage of simplicity in structure, but it also has several problems. The fact that it always outputs complementary signals, bandwidth limitation by interband transition time(~ns) of electrons and decrease in extinction ratio by amplified spontaneous emission are the examples of such problems.

SUMMARY OF THE INVENTION

The object of the present invention to provide an all-optical wavelength converter which uses a semiconductor optical amplifier and a polarization interferometer, the converter capable of converting the wavelength of a signal light to a wanted wavelength by using an all-optical method.

According to the present invention, the all optical wavelength converter that uses a semiconductor optical amplifier and a polarization interferometer comprises a wavelength converter which modulates a probe light into a inverting waveform to a signal light and outputs the modulated light by using the cross gain modulation, a phenomenon that occurs while the signal light and the probe light pass together through an optical splitter/combiner, a semiconductor optical amplifier and a filter at the same time, a polarization interferometer which makes the probe light outputted from the semiconductor optical amplifier and having the inverting waveform to the signal light undergo a birefringence so that a predetermined time split occurs on it and outputs non-inverting wavelength converted signal.

According to the present invention, the device executes an all-optical signal wavelength conversion that converts light to light directly instead of executing a two-step electro-optical conversion that converts light signal into electric signal at first step and electric signal into light signal again at second step. This all-optical signal wavelength conversion makes it possible to carry out ultrahigh-speed conversion that has almost no limitation on time bandwidth of input signals compared to the electro-optical conversion.

DETAILED DESCRIPTION OF THE INVENTION

Now the present invention will be explained in detail with the accompanying drawings.

Figure 1:
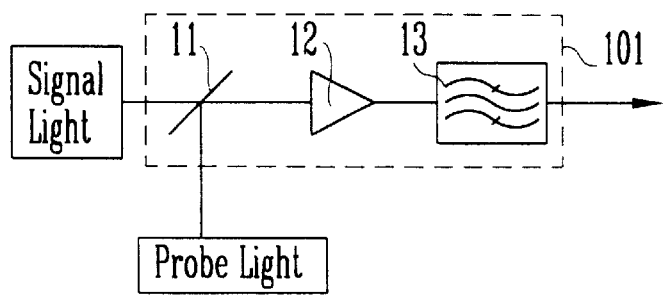
FIG. 1 is a schematic diagram of a wavelength converter using cross gain modulation in a conventional semiconductor amplifier.
Figure 2:
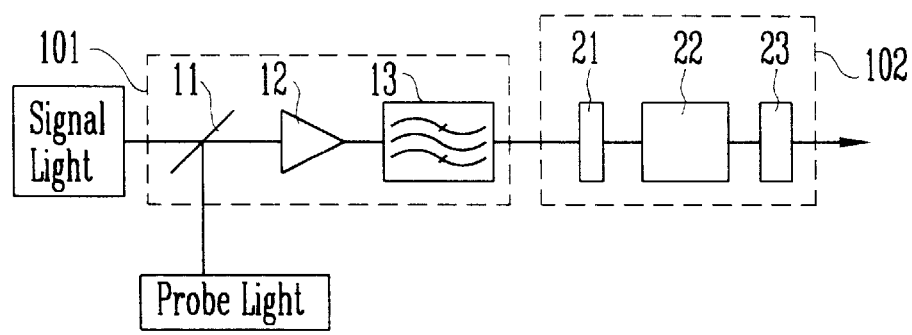
FIG. 2 is a schematic diagram of an all-optical wavelength converter according to the present invention using a semiconductor optical amplifier and a polarization interferometer.

FIG. 2 is a schematic diagram of an all-optical wavelength converter according to the present invention using a semiconductor optical amplifier and a polarization interferometer.

Though it is possible to construct the device from several basic forms, the description is focused on a wavelength converter including a semiconductor optical amplifier 101 and a polarization interferometer 102. The wavelength converter 101 using XGM includes an optical splitter/combiner 11, a semiconductor optical amplifier 12 and an optical wavelength filter 13. The polarization interferometer includes a half-wave plate 21, a birefringent material 22 and a polarizer 23.

The operation of the device described above can be explained with the aid of FIGS. 3a through 3d.

Figure 3A:
FIGS. 3a through 3d are waveforms at respective nodes to explain the operation of an all-optical wavelength converter according to the present invention using a semiconductor optical amplifier and a polarization interferometer.

A return-to-zero(RZ) signal light, as shown in FIG. 3a, is inputed into the semiconductor optical amplifier 12 together with a probe light via the optical splitter/combiner 11.

Figure 3B:
Figure 3C:

As shown in FIG. 3b, the probe light outputted from the optical filter 13 through which only the wavelength of the semiconductor optical amplifier 12 and the probe light can pass is modulated to a inverting waveform to the signal light by XGM of the signal light.

And owing to the slow recombination time of the carrier density, the wavelength-converted waveform undergoes triangle-distortion. This triangle-distorted one is a general XGM waveform. This XGM waveform having the shape of triangle is inputted into the polarization interferometer having a half-wave plate 21, a birefringent material 22 and a polarizer 23.

At this time, the half-wave plate 21 is adjusted to make the polarization of the XGM output have a 45° tilt to the fast axis of the birefringent material included in the polarization interferometer.

The components of the probe light related to the fast axis (FIG. 3c) and the slow axis (FIG. 3b), respectively, undergo time split of T by a birefringence and the magnitude is proportional to the product of the difference between refractive indexes of two axes by the length of optical fiber.

If the length of the birefringent material is set so that the initial state of the interferometer is the state of distractive interference, the output is restrained by the distructive interference when the components of two axes are overlapped and it is able to come out only when they are not overlapped. So the slow part of the XGM component can hardly come out.

Figure 3D:
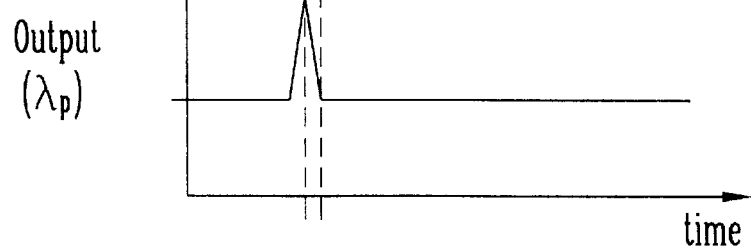

As shown in FIG. 3d, the final output of the converted probe light is not inverted compared to the input signal light and in coincidence with it. The interferometer used in the present invention is biased toward the state of distructive interference, so the amplified spontaneous emission come out from the semiconductor optical amplifier 12 is eliminated and not shown in the converted signal and the device has the bandwidth that is not dependent on the slow density recombination time of electrons.

As explained so far, the device according to the present invention has excellent performance when it is used for matching the wavelength of the transmitted signals to the wavelength of respective sub-net or node and for wavelength reuse in ultrahigh speed wavelength division multiplexing optical communication system network.

What is claimed:

1. An all-optical wavelength converter using a semiconductor optical amplifier and a polarization interferometer comprising:

a wavelength converter which modulates a probe light into a inverting waveform to a signal light and outputs the modulated light by using cross gain modulation, a phenomenon that occurs while the signal light and the probe light pass together through an optical splitter/combiner, a semiconductor optical amplifier and a filter at the same time;

a polarization interferometer which makes the probe light outputted from the wavelength converter and having the inverting waveform to the signal light undergo a birefringence so that a predetermined time split occurs on it and provides a non-inverting wavelength conversion and suppresses the slow XGM components in the converted outputs due to the slow carrier recombination time.

2. The all-optical wavelength converter using a semiconductor optical amplifier and a polarization interferometer according to claim 1, wherein said polarization interferometer comprises a half-wave plate, a birefringent material and a polarizer.

* * * * *